United States Patent

(12) United States Patent
Johns

(10) Patent No.: US 6,593,172 B2
(45) Date of Patent: Jul. 15, 2003

(54) DESIGN AND PROCESSING OF ANTIFUSE STRUCTURE

(75) Inventor: Susan Johns, Cardiff (GB)

(73) Assignee: International Rectifier Corporation, El Segundo, CA (US)

(*) Notice: Subject to any disclaimer, the term of this patent is extended or adjusted under 35 U.S.C. 154(b) by 0 days.

(21) Appl. No.: 09/859,950

(22) Filed: May 21, 2001

(65) Prior Publication Data
US 2002/0168801 A1 Nov. 14, 2002

(51) Int. Cl.[7] .......................... H01L 21/82; H01L 21/44; H01L 21/326; H01L 21/4763; H01L 29/00
(52) U.S. Cl. .......................... 438/131; 438/113; 438/467; 438/600; 438/643; 257/530
(58) Field of Search ........................ 438/113, 467, 438/600, 639, 642, 643, 131; 257/530

(56) References Cited

U.S. PATENT DOCUMENTS

| 5,369,054 A | * 11/1994 | Yen et al. ............ 438/600 |
| 5,374,792 A | * 12/1994 | Ghezzo et al. ....... 200/16 B |
| 5,451,810 A | * 9/1995 | Tigelaar et al. ...... 257/530 |
| 5,573,970 A | 11/1996 | Pramanik et al. ...... 437/60 |
| 5,614,756 A | * 3/1997 | Forouhi et al. ....... 257/530 |
| 5,670,818 A | * 9/1997 | Forouhi et al. ....... 257/530 |
| 5,759,876 A | * 6/1998 | Singlevich et al. .... 438/131 |
| 5,789,795 A | 8/1998 | Sanchez et al. ....... 257/530 |
| 5,856,233 A | * 1/1999 | Bryant et al. ........ 438/600 |
| 5,913,138 A | * 6/1999 | Yamaoka et al. ....... 438/600 |
| 5,970,372 A | * 10/1999 | Hart et al. ........... 438/600 |
| 6,107,165 A | 8/2000 | Jain et al. ........... 438/467 |
| 6,111,302 A | * 8/2000 | Zhang et al. ......... 257/530 |
| 6,159,836 A | * 12/2000 | Wei .................. 438/600 |
| 6,251,710 B1 | * 6/2001 | Radens et al. ........ 438/161 |
| 6,403,472 B1 | * 6/2002 | Woodbury et al. ...... 438/642 |

FOREIGN PATENT DOCUMENTS

| GB | 0660408 A1 | * 6/1995 |
| JP | 405326511 A | * 12/1993 |
| JP | 406077162 A | * 3/1994 |
| JP | 406120413 A | * 4/1994 |
| JP | 406120479 A | * 4/1994 |
| JP | 406268077 A | * 9/1994 |
| JP | 406291191 A | * 10/1994 |

* cited by examiner

Primary Examiner—Matthew Smith
Assistant Examiner—Chuong A Luu
(74) Attorney, Agent, or Firm—Ostrolenk, Faber, Gerb & Soffen, LLP

(57) ABSTRACT

The prior art requires the selective removal of antifuse material from the bottom of the standard via. This cannot always be accomplished without damage to the nearby antifuse. In addition, in the absence of antifuse structural isolation, problems were encountered at M2 etch in consistently removing the full thickness of metallic material at this level. Shorting due to underetch was often encountered. These problems were solved by first forming only the antifuse via. This allowed the via to be controlled and optimized for antifuse requirements and for the antifuse material to be patterned without regard to possible side effects on the standard vias. Design rules for overlaps of overfuse and M2 layers were amended such that each antifuse is individually isolated. The latter were then formed, without (as in the prior art) any concerns that the antifuse might be affected. The result is an antifuse that is well isolated from other wiring and a standard via that will facilitate good electrical contact between metal layer 1 and 2.

15 Claims, 3 Drawing Sheets

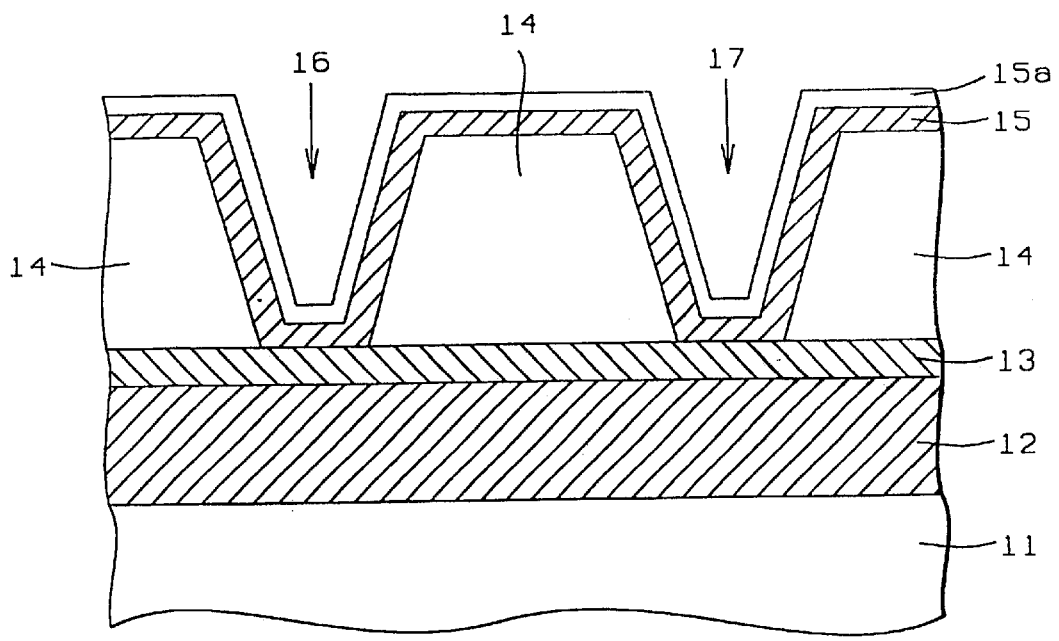
FIG. 1 – Prior Art
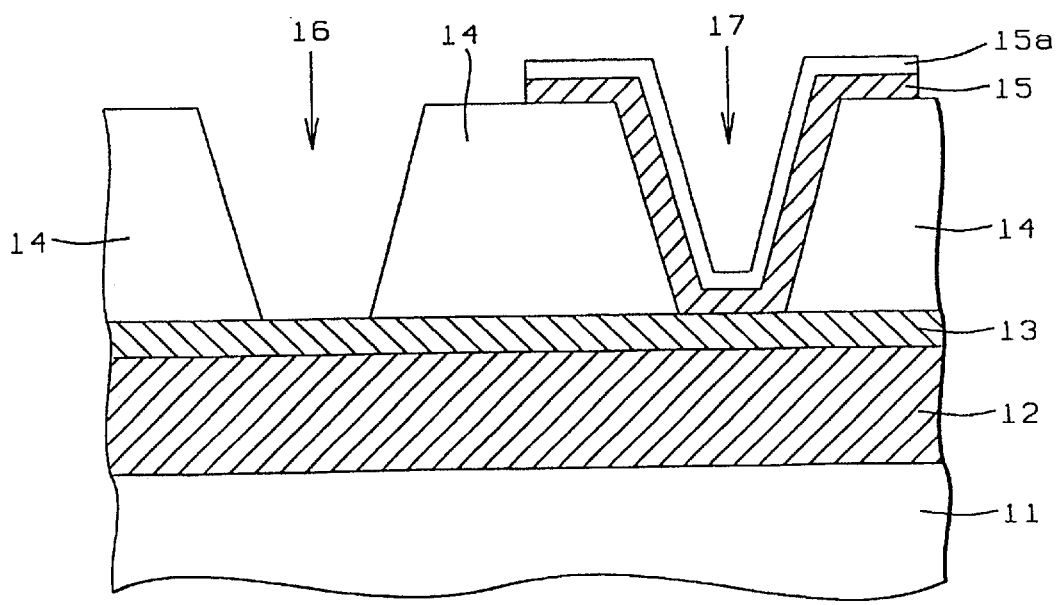
FIG. 2 – Prior Art

DESIGN AND PROCESSING OF ANTIFUSE STRUCTURE

FIELD OF THE INVENTION

The invention relates to the general field of integrated circuits with particular reference to programmable circuitry based on antifuses.

BACKGROUND OF THE INVENTION

To meet the needs of customers who wish to manufacture small volumes of custom chips without the delay and expense of going to a foundry, field programmable chips such as PLAs (programmable logic arrays) and PGAs (programmable gate arrays) have been available for some time. Personalization may be effected dynamically (by means of pass transistors) enabling a chip to be personalized many times or a write-once technology may be employed (with an attendant improvement in circuit density and speed). Implementation of write-once personalization may be accomplished by either breaking existing connections or by forming new ones.

The element that enables the formation of new connections is the antifuse. This is a connection between two layers of metal made through a via which includes in its serial path a layer of material that, as initially deposited has relatively high resistivity. When its temperature is raised above some critical value this material undergoes a phase change which causes its resistivity to drop by several orders of magnitude. Said phase change is commonly (though not necessarily) a change from an amorphous to a crystalline state. The necessary heating is most conveniently effected by passing a suitable current pulse through the afore-mentioned via.

Since the via that contains the layer of antifuse material is similar to the standard vias routinely used for connecting between wiring layers it has been the practice of the prior art to form both via types in a single operation. Referring now to FIG. 1, we show there, in schematic cross-section, a substrate 11 (typically the upper portion of an integrated circuit) on whose topmost surface a first layer of metal 12 (M1) has been deposited. Layer 12 is coated with titanium nitride layer 13 which will serve as a barrier layer. Dielectric layer 14 lies over layer 13 and, as can be seen, two via holes (16 and 17), that pass through it have been simultaneously formed, and then lined with amorphous silicon layer 15 which will be used as the antifuse material. To protect the antifuse layer, a protective coating 15a of titanium and titanium nitride is then immediately deposited.

The next step in the prior art process is illustrated in FIG. 2 where amorphous silicon layer 16 has been selectively removed from everywhere except inside, and close to, via hole 17. It is difficult to create a plasma etch process that will remove amorphous silicon material from features with aspect ratios of the order encountered in a via while still maintaining the critical dimensions of the masked feature overlying the antifuse via.

Should any material from layer 15 or 15a be left behind in via hole 16, a high contact resistance between the two metal layers that are connected by that via will be introduced. If over-etching is done in an attempt to remedy this, there is a danger that the overlap of the amorphous silicon layer over the via hole 17 will be reduced, causing damage to the resulting antifuse structure.

Previously, antifuses were not isolated individually. This cause problems during metal 2 (M2) etch where two layers of titanium and titanium nitride, as well as the amorphous, all needed to be simultaneously etched. Incomplete etching at this stage can cause metal shorting.

The present invention discloses a solution to the above problems.

A routine search of the prior art was performed with the following references of interest being found:

U.S. Pat. No. 6,159,836 (Wei) shows a TiN/αSi/TiN sandwich anti-fuse structure. U.S. Pat. No. 5,789,795 (Sanchez et al.), U.S. Pat. No. 5,573,970 (Pramanik et al.), and U.S. Pat. No. 6,107,165 (Vain et al.) all show related anti-fuse structures, some with etch stops.

SUMMARY OF THE INVENTION

It has been an object of the present invention to provide a process for manufacturing both an antifuse and a standard via.

A further object has been that said process permit over-etching of the standard vias, as needed.

Another object has been that the process allow close control of the thickness of the antifuse layer.

Still another object has been that the antifuse be fully encapsulated and isolated from other antifuse structures.

These objects have been achieved by first forming only the antifuse via. This allows etch time to be optimized. Overetch into the titanium nitride layer can cause antifuses to short to underlying metal. Underetch can render the antifuse unprogrammable if dielectric remains in the via. In addition, the antifuse material may be patterned without regard to possible side effects on the standard vias. The latter are then formed, without (as in the prior art) any concerns that the antifuse may be affected. Furthermore, these standard vias may be overetched in order to clear the thick titanium nitride layer and to ensure good electrical contact and low via resistance. The result is an antifuse that is well isolated from other antifuses and a standard via that will facilitate good electrical contact between metal layer 1 and 2.

BRIEF DESCRIPTION OF THE DRAWINGS

FIG. 1 shows the starting point for the prior art process.

FIG. 2 shows how, in the prior art, it is necessary to selectively remove antifuse material from the vicinity of the standard via.

DESCRIPTION OF THE PREFERRED EMBODIMENTS

Figure 3:
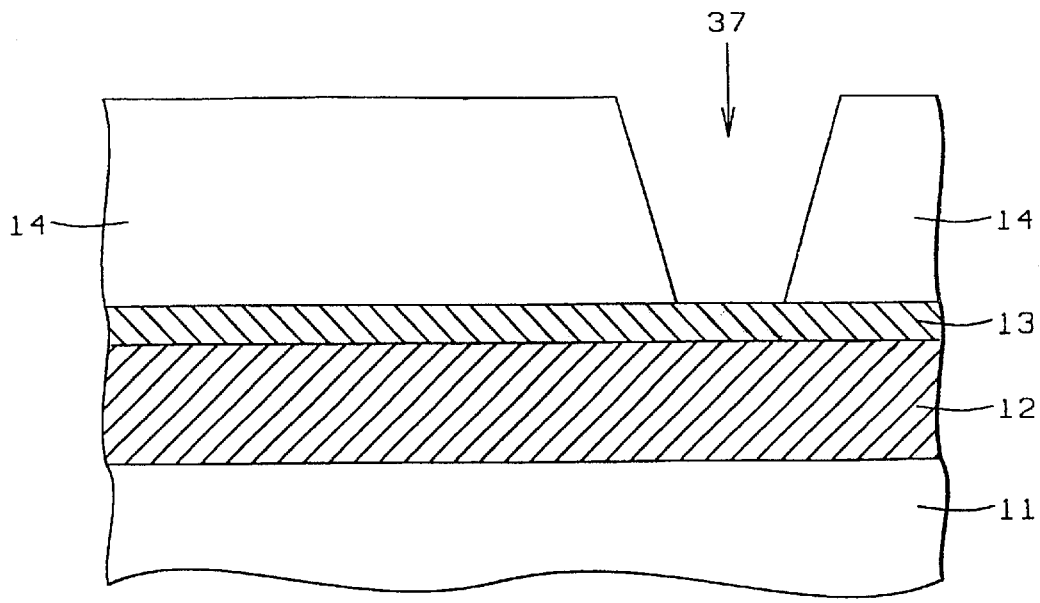
FIG. 3 shows the starting point for the process of the present invention.

Referring now to FIG. 3, we begin a description of the process of the present invention and the structure that it produces. The starting point is similar to that taught by the prior art in that substrate 11 (typically the upper portion of an integrated circuit) on whose topmost surface a first layer of metal 12 (M1) has been deposited. Layer 12 (typically aluminum although other metals may be substituted by those skilled in the art) is coated with titanium nitride layer 13 which will serve as a barrier layer. Dielectric layer 14 lies over layer 13 but, in a key departure from the prior art, only one via hole (37) has been formed. This first via hole has a width of between about 0.9 and 1.1 microns and the process used to etch this via hole employed the following chemistry: $CHF_3 CF_4/Ar/N_2$. The inclusion of nitrogen provides good selectivity for TiN. We note here that other suitable etch chemistries could also have been used.

It is important to note that etch time for this process is critical. Overetching leads to thinning of TiN layer 13 which may cause antifuse shorts. Underetching may leave dielectric material in the via and make the antifuse unprogrammable.

Our preferred material for dielectric layer 14 has been TEOS tetraetyhyl orthosilicate) but other materials such as BPSG (boro-phosphosilicate glass) or PSG could also have been used without changing the effectiveness of the process. Layer 14 was deposited to a thickness between about 1.15 and 1.35 microns.

Next, layer 15 of a material suitable for use as an antifuse is deposited over the surface of 14, including inside via hole 37. Our material of choice has been amorphous silicon but other materials with similar properties such as oxides or polysilicon could be substituted without departing from the spirit of the invention. The antifuse layer was deposited to a thickness between about 400 and 500 Angstroms, this being based on the intended operating voltage of the programming system so that thicknesses outside this range could be used without departing from the spirit of the invention.

Figure 4:
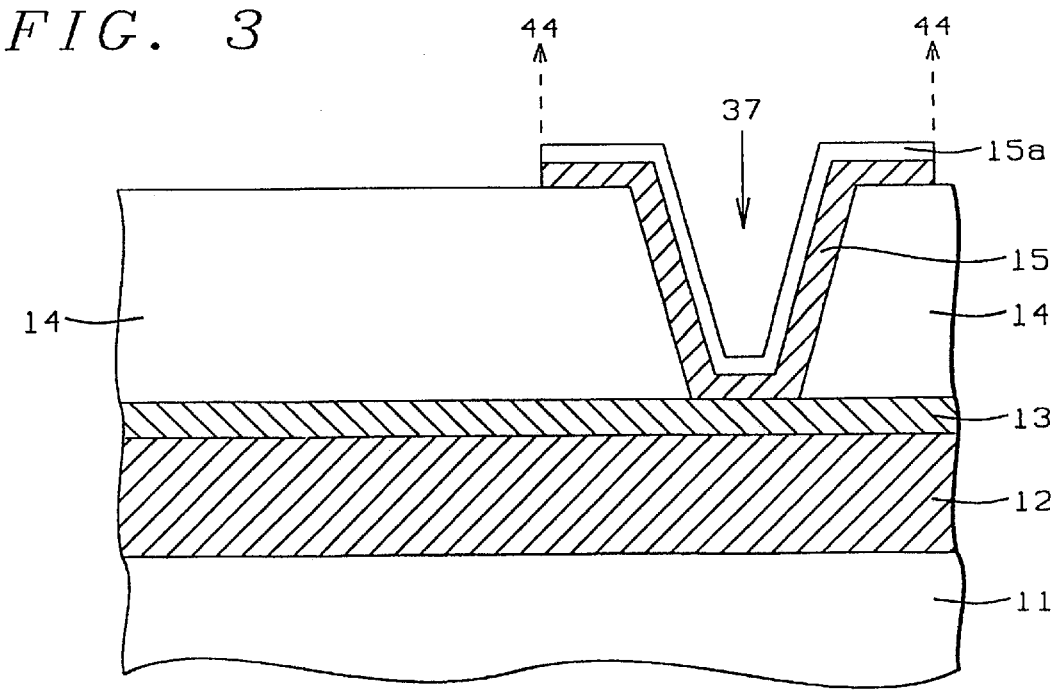
FIG. 4 shows the formation of the antifuse layer.

Immediately following the deposition of the amorphous layer, a protective layer of titanium nitride or titanium (15a) is laid down. Then, as seen in FIG. 4, layer 15 is patterned and etched so that it is removed everywhere except inside a boundary (shown schematically as 44) that surrounds the via hole, thus overlapping the antifuse by about 0.4 mm. Because there is no concern about over or under etching nearby standard via holes, boundary 44 can be precisely defined and there is no danger of unintentionally removing some amount of layer 15.

Figure 5:
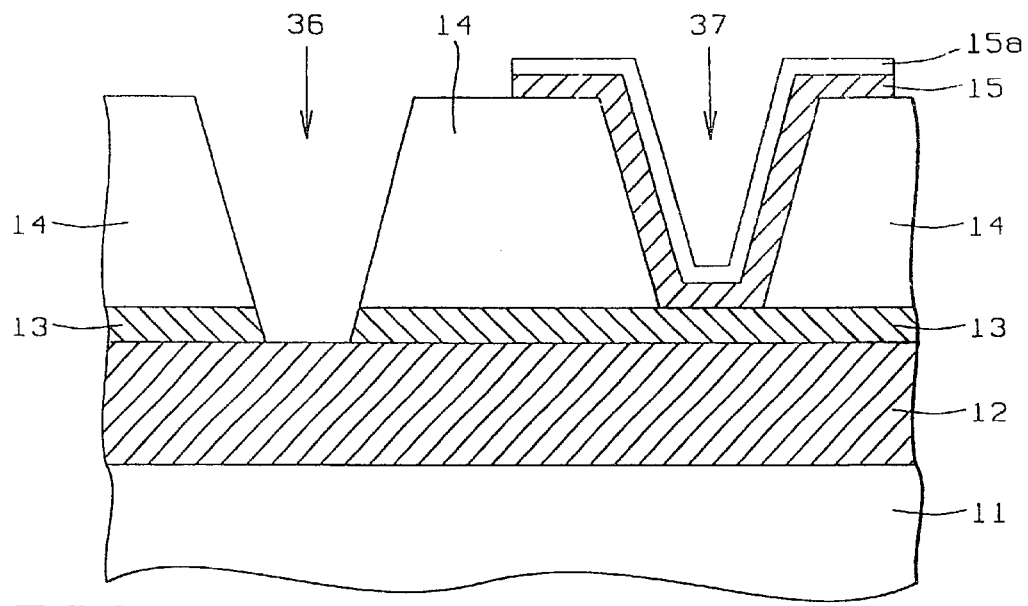
FIG. 5 shows the formation of a standard via near the antifuse.

The process continues now with the formation of a second (standard) via hole 36 as shown in FIG. 5. Unlike prior art processes, it is now possible, during the formation of 36, to etch via hole 36 for a time period that is sufficient for it to penetrate through barrier layer 13 into first metal layer 12. This guarantees that there will be good electrical contact between layer 12 and the next wiring level metal (M2). The standard via hole has a width of between about 0.9 and 1.1 microns and the process that was used to etch it was a $CHF_3/CF_4$ and Ar chemistry.

Figure 6:
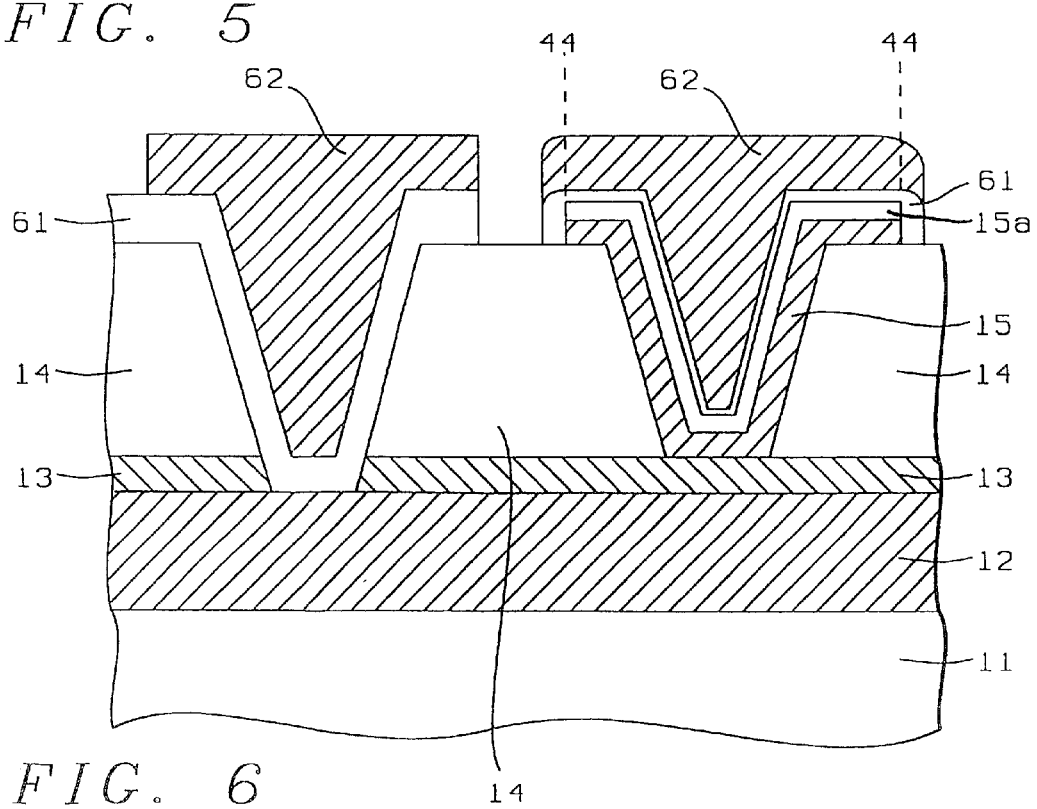
FIG. 6 shows the end product of the process of the present invention.

Referring now to FIG. 6, layer of titanium followed by titanium nitride 61 is then deposited over the surface followed by the deposition of next wiring level metal 62, the latter in sufficient quantity to overfill both via holes. Our preferred material for M2 has been aluminum alloy but other conductive materials could have been used without affecting the effectiveness of the invention.

The final step in the process is simultaneous patterning of layers 61 and 62 to form wiring patterns for the integrated circuit. A key feature is that M2 fully overlaps the aforementioned antifuse boundary, thereby fully isolating and encapsulating the antifuse while at the same time forming the standard via.

Antifuse design rules for overlap of the M2 layer are 0.5 mm around the antifuse definition. This ensures that each antifuse is individually isolated and protected by M2 coverage.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a semiconductor device containing both a standard via and an antifuse, comprising:

depositing a titanium nitride layer over a first metal layer, depositing a dielectric layer, having an upper surface, on said titanium nitride layer;

through etching, forming a first via hole that has a floor and that extends from said upper surface to the titanium nitride layer, said etching step being of sufficient duration to ensure removal of all dielectric material from said via hole floor without removal of titanium nitride;

depositing over said upper surface, including inside the first via hole, a layer of antifuse material that further comprises a three layer laminate of titanium nitride on titanium on amorphous silicon;

patterning the layer of antifuse material whereby the antifuse material is limited to being inside a boundary that surrounds the via hole, thereby forming the antifuse;

etching the dielectric layer to form a second via hole that has a floor and that extends from said upper surface to the first metal layer;

successively depositing layers of titanium and titanium nitride and then depositing a metal layer thereon; and patterning the metal layer and the titanium and titanium nitride layer to form a wiring pattern that fully overlaps said boundary, thereby fully isolating and encapsulating the antifuse and forming the standard via.

2. The process described in claim 1 wherein said antifuse material is selected from the group consisting of amorphous silicon, polysilicon, and an oxide.

3. The process described in claim 1 wherein said dielectric layer is selected from the group consisting of BPSG and PSG.

4. A process for manufacturing a semiconductor device containing both a standard via and an antifuse, comprising the sequential steps of:

providing an integrated circuit having a first metal layer as its topmost layer;

depositing a titanium nitride layer over said first metal layer;

depositing a dielectric layer having an upper surface, on said titanium nitride layer;

patterning and etching the dielectric layer to form a first via hole that has a floor and that extends from said upper surface to the titanium nitride layer, said etching step being of sufficient duration to ensure removal of all dielectric material from said via hole floor without removal of titanium nitride;

over said upper surface, including inside the first via hole, depositing a layer of amorphous silicon followed immediately by successive layers of titanium and titanium nitride;

patterning the layers of amorphous silicon, titanium, and titanium nitride whereby said layers are limited to being inside a boundary that surrounds the via hole, thereby forming the antifuse;

patterning and etching the dielectric layer to form a second via hole that has a floor and that extends from said upper surface to the first metal layer;

depositing layers of titanium and titanium nitride within the second via hole;

depositing a second metal layer over said layers of titanium and titanium nitride of said second via hole; and patterning said second metal layer and said layers of titanium and titanium nitride to form wiring for said integrated circuit, said wiring fully overlapping said boundary, thereby fully isolating and encapsulating the antifuse and forming the standard via.

5. The process described in claim 4 said first metal layer is an aluminum alloy.

6. The process described in claim 4 wherein said dielectric layer is TEOS.

7. The process described in claim 4 wherein said second metal layer is an aluminum alloy.

8. The process described in claim 4 wherein said dielectric layer is deposited to a thickness between about 1.15 and 1.35 microns.

9. The process described in claim 4 wherein said first via hole has a width of between about 0.9 and 1.1 microns.

10. The process described in claim 4 wherein the step of etching the first via hole further comprises using the gases $CHF_3$, $CF_4$, Ar, and $N_2$ as an etch chemistry.

11. The process described in claim 4 wherein said layer of amorphous silicon is deposited to a thickness between about 400 and 500 Angstroms.

12. The process described in claim 4 wherein said boundary overlaps the antifuse via by about 0.4 mm on all sides.

13. The process described in claim 4 wherein said second via hole has a width of between about 0.9 and 1.0 microns.

14. The process described in claim 4 wherein the step of etching the second via hole further comprises using the gases $CHF_3$, $CF_4$, and Ar as an etch chemistry.

15. The process described in claim 4 wherein M2 overlaps the antifuse structure by about 0.5 mm on all sides.

* * * * *